United States Patent
Taga et al.

(10) Patent No.: US 10,224,473 B2
(45) Date of Patent: Mar. 5, 2019

(54) THERMOELECTRIC CONVERSION MATERIAL, THERMOELECTRIC CONVERSION ELEMENT AND THERMOELECTRIC CONVERSION MODULE

(71) Applicant: NIPPON CHEMICAL INDUSTRIAL CO., LTD., Tokyo (JP)

(72) Inventors: Kazuya Taga, Tokyo (JP); Ryota Satomura, Tokyo (JP); Yasuhiro Nakaoka, Tokyo (JP)

(73) Assignee: NIPPON CHEMICAL INDUSTRIAL CO., LTD., Tokyo (JP)

( * ) Notice: Subject to any disclaimer, the term of this patent is extended or adjusted under 35 U.S.C. 154(b) by 0 days.

(21) Appl. No.: 15/558,315

(22) PCT Filed: Mar. 15, 2016

(86) PCT No.: PCT/JP2016/058057
§ 371 (c)(1),
(2) Date: Sep. 14, 2017

(87) PCT Pub. No.: WO2016/148117
PCT Pub. Date: Sep. 22, 2016

(65) Prior Publication Data
US 2018/0062060 A1 Mar. 1, 2018

(30) Foreign Application Priority Data

Mar. 8, 2016 (JP) .................................. 2016-044066

(51) Int. Cl.
*H01L 35/18* (2006.01)
*C04B 35/453* (2006.01)
(Continued)

(52) U.S. Cl.
CPC ............. *H01L 35/18* (2013.01); *C01G 45/125* (2013.01); *C01G 51/66* (2013.01); *C04B 35/01* (2013.01);
(Continued)

(58) Field of Classification Search
CPC ......... H01L 35/18; H01L 35/08; H01L 35/34; C01G 51/66; C04B 35/453;
(Continued)

(56) References Cited

U.S. PATENT DOCUMENTS

2011/0146741 A1   6/2011   Hida et al.

FOREIGN PATENT DOCUMENTS

| JP | 3069701 B1 | 7/2000 |
| JP | 2001-223393 A | 8/2001 |

(Continued)

OTHER PUBLICATIONS

Zhang et al., Preparation and thermoelectric properties of highly oriented calcium cobalt oxides by solution combustion synthesis with post-spark plasma sintering, Journal of Optoelectronics and Advanced Materials, vol. 14, Issue No. 1-2, Jan.-Feb. pp. 67-71 (Year: 2012).*

(Continued)

*Primary Examiner* — Jayne L Mershon
(74) *Attorney, Agent, or Firm* — Westerman, Hattori, Daniels & Adrian, LLP

(57) ABSTRACT

There is provided a thermoelectric conversion material which is characterized by being composed of a sintered body of plate-like crystals of a composite oxide represented by general formula (2) $Bi_fCa_gM^3_hCo_iM^4_jO_k$, and by having a density of 4.0-5.1 $g/cm^3$. This thermoelectric conversion material is also characterized in that: when observed by SEM, the ratio of the plate-like crystals of a composite oxide represented by general formula (2) having an inclination in (Continued)

the major axis direction within 0±20° relative to the surface of the thermoelectric conversion material is 60% or more on the number basis; the average length of the lengths of the plate-like crystals of a composite oxide represented by general formula (2) is 20 μm or more; and the aspect ratio of the plate-like crystals of a composite oxide represented by general formula (2) is 20 or more.

5 Claims, 3 Drawing Sheets

(51) Int. Cl.
| | |
|---|---|
| *C04B 35/626* | (2006.01) |
| *C04B 35/634* | (2006.01) |
| *C01G 51/00* | (2006.01) |
| *C04B 35/622* | (2006.01) |
| *C04B 35/64* | (2006.01) |
| *H01L 35/08* | (2006.01) |
| *H01L 35/34* | (2006.01) |
| *C01G 45/12* | (2006.01) |
| *C04B 35/01* | (2006.01) |

(52) U.S. Cl.
CPC ........ *C04B 35/453* (2013.01); *C04B 35/6262* (2013.01); *C04B 35/6263* (2013.01); *C04B 35/6264* (2013.01); *C04B 35/62218* (2013.01); *C04B 35/62665* (2013.01); *C04B 35/62685* (2013.01); *C04B 35/634* (2013.01); *C04B 35/64* (2013.01); *H01L 35/08* (2013.01); *H01L 35/34* (2013.01); *C01P 2004/03* (2013.01); *C01P 2004/54* (2013.01); *C01P 2004/61* (2013.01); *C01P 2006/32* (2013.01); *C01P 2006/40* (2013.01); *C04B 2235/3201* (2013.01); *C04B 2235/3203* (2013.01); *C04B 2235/3208* (2013.01); *C04B 2235/3213* (2013.01); *C04B 2235/3215* (2013.01); *C04B 2235/3217* (2013.01); *C04B 2235/3225* (2013.01); *C04B 2235/3232* (2013.01); *C04B 2235/3239* (2013.01); *C04B 2235/3241* (2013.01); *C04B 2235/3251* (2013.01); *C04B 2235/3256* (2013.01); *C04B 2235/3258* (2013.01); *C04B 2235/3262* (2013.01); *C04B 2235/3272* (2013.01); *C04B 2235/3275* (2013.01); *C04B 2235/3277* (2013.01); *C04B 2235/3279* (2013.01); *C04B 2235/3281* (2013.01); *C04B 2235/3284* (2013.01); *C04B 2235/3296* (2013.01); *C04B 2235/3298* (2013.01); *C04B 2235/5436* (2013.01); *C04B 2235/606* (2013.01); *C04B 2235/612* (2013.01); *C04B 2235/77* (2013.01); *C04B 2235/788* (2013.01); *C04B 2235/9607* (2013.01)

(58) Field of Classification Search
CPC .......... C04B 35/62218; C04B 35/6262; C04B 35/6264; C04B 35/82855; C04B 35/634; C04B 35/64
USPC ....................................................... 136/238
See application file for complete search history.

(56) References Cited

FOREIGN PATENT DOCUMENTS

| | | | |
|---|---|---|---|
| JP | 2003-179272 | A | 6/2003 |
| JP | 2003-246678 | A | 9/2003 |
| JP | 2004-152846 | A | 5/2004 |
| JP | 2004-363576 | A | 12/2004 |
| JP | 2006-49796 | A | 2/2006 |
| JP | 2009-188319 | A | 8/2009 |
| JP | 2010-37131 | A | 2/2010 |
| JP | 2010-195620 | A | 9/2010 |
| JP | 2011-129838 | A | 6/2011 |
| JP | 2010-037131 | * | 2/2012 |

OTHER PUBLICATIONS

Park et al., "Thermoelectric properties of highly oriented Ca2.7Bi0.3Co4O9 fabricated by rolling process," Journal of the Ceramic Society of Japan, 2009, vol. 117, No. 5, pp. 643-646, cited in ISR.
Zhao et al., "Effect of Bi Doping on the Microstructure and Thermoelectric Properties of Ca3-xBixCo4O9 Oxides," Journal of Synthetic Crystals, 2010, vol. 39, No. 2, pp. 470-473, 480, cited in ISR.
International Search Report dated May 31, 2016, issued in counterpart International Application No. PCT/JP2016/058057 (2 pages).
Office Action dated Aug. 31, 2017, issued in Japanese Patent Application No. 2016-044066, with translation.
Written Opinion of the International Searching Authority dated May 31, 2016, issued in PCT/JP2016/058057, with translation.

* cited by examiner

Top view

Side view

Front view

Rear view

THERMOELECTRIC CONVERSION MATERIAL, THERMOELECTRIC CONVERSION ELEMENT AND THERMOELECTRIC CONVERSION MODULE

TECHNICAL FIELD

The present invention relates to a thermoelectric conversion material, and particularly relates to a thermoelectric conversion material including a $CoO_2$-based layered oxide useful as a p-type thermoelectric conversion material, as well as a thermoelectric conversion element and a thermoelectric conversion module using the thermoelectric conversion material.

BACKGROUND ART

Thermoelectric conversion is an energy conversion method in which the Seebeck effect is utilized to impart the temperature difference between both ends of a thermoelectric conversion material, thereby generating the potential difference to conduct electricity generation. In such thermoelectric generation, electricity is obtained by only disposing one end of the thermoelectric conversion material on a hot section produced by waste heat and disposing other end thereof in the air (room temperature), and connecting a conducting wire to each of both the ends. Accordingly, any movable appliances such as a motor and a turbine necessary for common electricity generation are not required at all. Therefore, there are the following advantages: the cost of electricity generation is low; any gas by burning or the like is not emitted; and electricity generation can be continuously performed until the thermoelectric conversion material is degraded.

As an oxide having n-type thermoelectric conversion characteristics, there have been proposed a calcium-manganese composite oxide of $CaMnO_3$, such a calcium-manganese composite oxide in which Ca or Mn is partially replaced with a proper element, and the like, and the calcium-manganese composite oxide is expected to be put in practical use as an n-type oxide thermoelectric conversion material because of exhibiting favorable conductivity even in air at high temperatures and having a Seebeck coefficient of more than 100 µV/K (for example, Patent Literature 1).

On the other hand, as an oxide having p-type thermoelectric conversion characteristics, there have also been proposed a $CoO_2$-based layered oxide such as calcium cobaltite ($Ca_3Co_4O_9$), a $CoO_2$-based layered oxide in which Ca and/or Co of the calcium cobaltite are/is partially replaced with a proper element, and the like (see, for example, Patent Literatures 2 to 3).

A thermoelectric conversion material in which a $CoO_2$-based layered oxide is used is prepared so that a plate crystal of the $CoO_2$-based layered oxide is used and the crystal plane is oriented in one direction in order to exhibit excellent thermoelectric characteristics.

Patent Literature 4 below has proposed a thermoelectric conversion element in which a $CoO_2$-based layered oxide is used as a p-type thermoelectric conversion material, and has disclosed, as a method for preparing the thermoelectric conversion material, a method including subjecting a plate crystal of the $CoO_2$-based layered oxide to pressure molding, followed by sintering by hot pressing under pressure, so-called a pressure sintering method.

While the pressure sintering method in Patent Literature 4 provides a thermoelectric conversion material in which a plate crystal of the $CoO_2$-based layered oxide is oriented in the crystal plane direction and which is excellent in orientation, the pressure sintering method has difficulty in preparing a sintered product in a large amount at the same time, and is not industrially effective.

As a method for producing a thermoelectric conversion material including a $CoO_2$-based layered oxide in an industrially effective manner, Patent Literature 5 has proposed a method including subjecting a plate powder made of a cobalt compound such as $Co_3O_4$ or $Co(OH)_2$, a calcium compound and a fluorine compound to molding according to a doctor blade method, a press molding method, a rolling method, an extrusion method, or the like, followed by sintering at normal pressure.

CITATION LIST

Patent Literatures

Patent Literature 1: Japanese Patent Laid-Open No. 2010-37131
Patent Literature 2: Japanese Patent No. 3069701
Patent Literature 3: Japanese Patent Laid-Open No. 2001-223393
Patent Literature 4: Japanese Patent Laid-Open No. 2006-49796
Patent Literature 5: Japanese Patent Laid-Open No. 2004-152846

SUMMARY OF INVENTION

Technical Problem

While thermoelectric generation has attracted attention as one promising technique for solving an energy problem to be concerned in future, there is demanded for a method for producing a thermoelectric conversion material which includes a $CoO_2$-based layered oxide and which is excellent in thermoelectric characteristics, in an industrially effective manner.

Accordingly, an object of the present invention is to provide a thermoelectric conversion material which is produced in an industrially effective manner and which includes a $CoO_2$-based layered oxide having excellent thermoelectric characteristics, as well as a thermoelectric conversion element and a thermoelectric conversion module using the thermoelectric conversion material.

Solution to Problem

The present inventors have made intensive studies in view of the above circumstances, and as a result, have found that a $CoO_2$-based layered oxide obtained by using a plate crystal of a specified calcium cobaltite as a template and using the plate crystal of the calcium cobaltite, a bismuth compound, a cobalt compound and a calcium compound as reaction raw materials is promoted in terms of crystal growth in the longitudinal direction during a firing reaction and therefore formed into a plate crystal grown in the longitudinal direction, a thermoelectric conversion material including a sintered product in which a plate crystal of a composite oxide, having a specified longer diameter, is oriented in the longitudinal direction of the crystal plane has thermoelectric characteristics comparable with those of a thermoelectric conversion material obtained by a pressure sintering method, and the like, thereby leading to completion of the present invention.

That is, aspect (1) of the present invention provides a thermoelectric conversion material, wherein
the thermoelectric conversion material is a sintered product of a plate crystal of a composite oxide represented by the following general formula (2):

  (2)

wherein $M^3$ represents one or more elements selected from the group consisting of Na, K, Li, Ti, V, Cr, Mn, Fe, Ni, Cu, Zn, Pb, Sr, Ba, Al, Y and lanthanoid, and $M^4$ represents one or more elements selected from the group consisting of Ti, V, Cr, Mn, Fe, Ni, Cu, Mo, W, Nb and Ta; f satisfies $0<f\leq1.0$, g satisfies $2.0\leq g\leq3.6$, h satisfies $0\leq h\leq1.0$, i satisfies $3.5\leq i\leq4.5$, j satisfies $0\leq j\leq0.5$, and k satisfies $8.0\leq k\leq10.0$;
the thermoelectric conversion material has a density of 4.0 to 5.1 g/cm³,
a proportion of a plate crystal of the composite oxide represented by general formula (2), in which an inclination of a longitudinal direction relative to a surface of the thermoelectric conversion material is within 0±20° in SEM observation, is 60% or more on a number basis; and
the plate crystal of the composite oxide represented by general formula (2) has an average longer diameter length of 20 μm or more and an aspect ratio of 20 or more.

Aspect (2) of the present invention provides a thermoelectric conversion element including a p-type thermoelectric conversion material and an n-type thermoelectric conversion material, wherein the p-type thermoelectric conversion material is the thermoelectric conversion material according to aspect (1) of the present invention.

Aspect (3) of the present invention provides a thermoelectric conversion module including the thermoelectric conversion element according to aspect (2) of the present invention.

Advantageous Effects of Invention

The present invention can provide a thermoelectric conversion material which is produced in an industrially effective manner and which includes a $CoO_2$-based layered oxide having excellent thermoelectric characteristics, as well as a thermoelectric conversion element and a thermoelectric conversion module using the thermoelectric conversion material.

BRIEF DESCRIPTION OF DRAWINGS

FIG. 2 FIGS. 2A through 2D each is a schematic view of one embodiment of the thermoelectric conversion module of the present invention.

DESCRIPTION OF EMBODIMENTS

Figure 1:
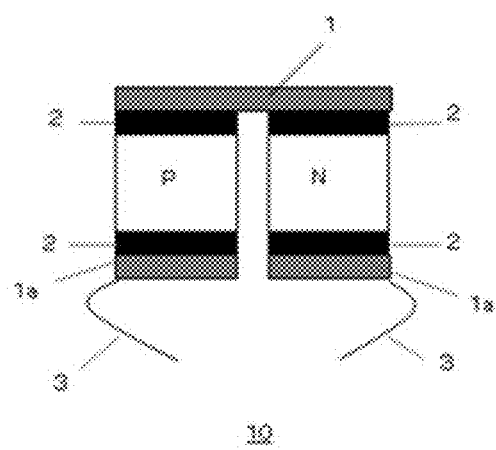
FIG. 1 is a schematic view of one embodiment of the thermoelectric conversion element of the present invention.

The thermoelectric conversion material of the present invention is a thermoelectric conversion material, wherein the thermoelectric conversion material is a sintered product of a plate crystal of a composite oxide represented by the following general formula (2):

  (2)

wherein $M^3$ represents one or more elements selected from the group consisting of Na, K, Li, Ti, V, Cr, Mn, Fe, Ni, Cu, Zn, Pb, Sr, Ba, Al, Y and lanthanoid, and $M^4$ represents one or more elements selected from the group consisting of Ti, V, Cr, Mn, Fe, Ni, Cu, Mo, W, Nb and Ta; f satisfies $0<f\leq1.0$, g satisfies $2.0\leq g\leq3.6$, h satisfies $0\leq h\leq1.0$, i satisfies $3.5\leq i\leq4.5$, j satisfies $0\leq j\leq0.5$, and k satisfies $8.0\leq k\leq10.0$;
the thermoelectric conversion material has a density of 4.0 to 5.1 g/cm³,
a proportion of a plate crystal of the composite oxide represented by general formula (2), in which the inclination of the longitudinal direction relative to the surface of the thermoelectric conversion material is within 0±20° in SEM observation, is 60% or more on a number basis; and
the plate crystal of the composite oxide represented by general formula (2) has an average longer diameter length of 20 μm or more and an aspect ratio of 20 or more.

The thermoelectric conversion material of the present invention is a sintered product of a plate crystal of a composite oxide represented by the following general formula (2):

  (2)

In general formula (2), $M^3$ represents one or more elements selected from the group consisting of Na, K, Li, Ti, V, Cr, Mn, Fe, Ni, Cu, Zn, Pb, Sr, Ba, Al, Y and lanthanoid, and $M^4$ represents one or more elements selected from the group consisting of Ti, V, Cr, Mn, Fe, Ni, Cu, Mo, W, Nb and Ta. Examples of the lanthanoid element represented by $M^3$ include La, Ce, Pr, Nd, Sm, Eu, Gd, Tb, Dy, Ho, Er, Tm, and Lu. $M^2$ and $M^2$ represent an element to be added in order to impart electric conductivity. f satisfies $0<f\leq1.0$, preferably $0.2\leq f\leq0.8$. When f is within the above range, the thermoelectric conversion material is high in density and has excellent thermoelectric characteristics. g satisfies $2.0\leq g\leq3.6$, preferably $2.2\leq g\leq3.3$, particularly preferably $3.0<g\leq3.3$. h satisfies $0\leq h\leq1.0$, preferably $0.1\leq h\leq0.9$. i satisfies $3.5\leq i\leq4.5$, preferably $3.7\leq i\leq4.3$. j satisfies $0\leq j\leq0.5$, preferably $0.1\leq j\leq0.4$. k satisfies $8.0\leq k\leq10.0$, preferably $8.5\leq k\leq9.5$.

The composite oxide represented by general formula (2) is a $CoO_2$-based layered oxide of calcium cobaltite ($Ca_3Co_4O_9$), in which Ca is partially replaced with Bi, and, if necessary, further replaced with the $M^3$ element, and Co is, if necessary, partially replaced with the $M^4$ element. The composite oxide represented by general formula (2) has a structure where a layer having a rock salt type structure and a $CoO_2$ layer in which six of O's are octahedrally coordinated to Co and the resulting octahedrons are two-dimensionally aligned so as to mutually share sides are alternately stacked.

The thermoelectric conversion material of the present invention is a thermoelectric conversion material including a single phase composite oxide represented by general formula (2), in terms of X-ray diffraction.

The thermoelectric conversion material of the present invention is famed so that the plate crystal of the composite oxide represented by general formula (2), forming the thermoelectric conversion material, is developed in the longitudinal direction as compared with a conventional thermoelectric conversion material.

In the thermoelectric conversion material of the present invention, the plate crystal of the composite oxide represented by general formula (2) is oriented in the longitudinal direction of the crystal plane, namely, the surface of the thermoelectric conversion material is roughly parallel with the longitudinal direction of the crystal plane of the plate crystal of the composite oxide represented by general formula (2). Herein, the plate crystal being oriented in the longitudinal direction of the crystal plane is confirmed by subjecting the cross section of the thermoelectric conversion material to SEM observation at a magnification of 1000-fold. In addition, the phrase "the surface of the thermoelectric conversion material is roughly parallel with the longitudinal direction of the crystal plane of the plate crystal of the composite oxide represented by general formula (2)" means that the proportion of a plate crystal of the composite oxide, in which the inclination of the longitudinal direction relative to the surface of the thermoelectric conversion material is within 0±20°, is 60% or more on a number basis.

While the thermoelectric conversion material of the present invention is more excellent in thermoelectric characteristics as the plate crystal of the composite oxide represented by general formula (2) is higher in the content thereof oriented in the longitudinal direction of the crystal plane, the composite oxide contained in the thermoelectric conversion material is not necessarily needed to be fully oriented in the crystal plane of the longitudinal direction. When the thermoelectric conversion material is cut into two portions and the cross section obtained by such cutting is subjected to SEM observation at a magnification of 1000-fold, the proportion of a plate crystal of the composite oxide, in which the inclination of the longitudinal direction relative to the surface of the thermoelectric conversion material is within 0±20°, may be 60% or more on a number basis, and the proportion of a plate crystal of the composite oxide, in which the inclination of the longitudinal direction relative to the surface of the thermoelectric conversion material is within 0±15°, is preferably 65% or more on a number basis.

The density of the thermoelectric conversion material of the present invention is 4.0 to 5.1 g/cm³, preferably 4.2 to 5.1 g/cm³. When the density of the thermoelectric conversion material is within the above range, the thermoelectric conversion material can be increased in strength and enhanced in processability, thereby resulting in a reduction in resistivity of the thermoelectric conversion material.

The average longer diameter length of the plate crystal of the composite oxide represented by general formula (2), forming the thermoelectric conversion material of the present invention, is 20 μm or more, preferably 20 to 50 μm, particularly preferably 25 to 50 μm.

The average shorter diameter length of the plate crystal of the composite oxide represented by general formula (2), forming the thermoelectric conversion material of the present invention, is preferably 0.5 to 5 μm, particularly preferably 0.8 to 3 μm, particularly preferably 0.8 to 1.8 μm.

The aspect ratio of the plate crystal of the composite oxide represented by general formula (2), forming the thermoelectric conversion material of the present invention, is 20 or more, preferably 20 to 50. When aspect ratio of the plate crystal of the composite oxide represented by general formula (2), forming the thermoelectric conversion material, is within the above range, excellent thermoelectric characteristics are achieved.

Herein, the longer diameter, the shorter diameter and the aspect ratio of the plate crystal of the composite oxide represented by general formula (2) are the respective average values with respect to 10 particles arbitrarily extracted in the field of view in SEM observation at a magnification of 1000-fold of the plate crystal of the composite oxide represented by general formula (2).

Examples of the method for producing the thermoelectric conversion material of the present invention include a method (1) for producing the thermoelectric conversion material.

The method (1) for producing the thermoelectric conversion material is a method for producing the thermoelectric conversion material, including:

a slurry preparation step of preparing a raw slurry containing a plate crystal of a calcium cobaltite represented by the following general formula (1):

$$Ca_aM^1_bCo_cM^2_dO_e \qquad (1)$$

wherein $M^1$ represents one or more elements selected from the group consisting of Bi, Na, K, Li, Ti, V, Cr, Mn, Fe, Ni, Cu, Zn, Pb, Sr, Ba, Al, Y and lanthanoid, and $M^2$ represents one or more elements selected from the group consisting of Ti, V, Cr, Mn, Fe, Ni, Cu, Mo, W, Nb and Ta; and a satisfies 2.0≤a≤3.6, b satisfies 0<b≤1.0, c satisfies 2.0≤c≤4.5, d satisfies 0≤d≤2.0, and e satisfies 8.0≤e≤10.0; a bismuth compound, a calcium compound and a cobalt compound;

a sheet formation step of subjecting the raw slurry to sheet formation to prepare a raw material sheet containing the plate crystal of the calcium cobaltite represented by general formula (1), the bismuth compound, the calcium compound and the cobalt compound;

a stacking step of stacking the raw material sheet to prepare a raw material sheet laminate; and a firing step of firing the raw material sheet laminate to provide a thermoelectric conversion material which is a sintered product of a plate crystal of a composite oxide represented by the following general formula (2):

$$Bi_fCa_gM^3_hCo_iM^4_jO_k \qquad (2)$$

wherein $M^3$ represents one or more elements selected from the group consisting of Na, K, Li, Ti, V, Cr, Mn, Fe, Ni, Cu, Zn, Pb, Sr, Ba, Al, Y and lanthanoid, and $M^4$ represents one or more elements selected from the group consisting of Ti, V, Cr, Mn, Fe, Ni, Cu, Mo, W, Nb and Ta; f satisfies 0<f≤1.0, g satisfies 2.0≤g≤3.6, h satisfies 0≤h≤1.0, i satisfies 3.5≤i≤4.5, j satisfies 0≤j≤0.5, and k satisfies 8.0≤k≤10.0.

In other words, the method (1) for producing the thermoelectric conversion material includes a slurry preparation step, a sheet formation step, a stacking step and a firing step.

The slurry preparation step is a step of preparing a raw slurry containing a plate crystal of a calcium cobaltite represented by general formula (1), a bismuth compound, a calcium compound and a cobalt compound.

The calcium cobaltite in the slurry preparation step is a calcium cobaltite represented by general formula (1):

$$Ca_aM^1_bCo_cM^2_dO_e \qquad (1).$$

In general formula (1), $M^2$ represents one or more elements selected from the group consisting of Bi, Na, K, Li, Ti, V, Cr, Mn, Fe, Ni, Cu, Zn, Pb, Sr, Ba, Al, Y and lanthanoid, and $M^2$ represents one or more elements selected from the group consisting of Ti, V, Cr, Mn, Fe, Ni, Cu, Mo, W, Nb and Ta. $M^1$ represents an element to be added in order to impart electric conductivity, and $M^1$ preferably represents Bi. $M^2$ represents an element to be, if necessary, added in order to further improve thermoelectric characteristics. Examples of the lanthanoid element with respect to $M^1$ include La, Ce, Pr, Nd, Sm, Eu, Gd, Tb, Dy, Ho, Er, Tm, and Lu. a satisfies 2.0≤a≤3.6, preferably 2.2≤a≤3.3. b satisfies 0<b≤1.0, preferably 0.1≤b≤0.9. c satisfies 2.0≤c≤4.5, preferably 2.2≤c≤4.3. d satisfies 0≤d≤2.0, preferably 0.1≤d≤1.9. e satisfies 8.0≤e≤10.0, preferably 8.5≤e≤9.5.

The calcium cobaltite represented by general formula (1) is a known compound and is a $CoO_2$-based layered oxide of calcium cobaltite ($Ca_3Co_4O_9$), in which Ca is partially replaced with the $M^1$ element and Co is, if necessary, partially replaced with the $M^2$ element. The calcium cobaltite is known to have a structure where a layer having a rock salt type structure and a $CoO_2$ layer in which six of O's are octahedrally coordinated to Co and the resulting octahedrons are two-dimensionally aligned so as to mutually share sides are alternately stacked.

The calcium cobaltite represented by general formula (1) with respect to the slurry preparation step is a plate crystal. The plate crystal of the calcium cobaltite represented by general formula (1) functions as a template in the course of production of the thermoelectric conversion material of the present invention. In other words, the plate crystal of the calcium cobaltite is oriented in the longitudinal direction of the crystal plane in the sheet formation step, and thus such orienting can allow the plate crystal of the composite oxide represented by general formula (2) to be oriented in the longitudinal direction of the crystal plane.

The longer diameter of the plate crystal of the calcium cobaltite represented by general formula (1) is preferably 6 to 15 µm, particularly preferably 7 to 13 µm from the viewpoint that a thermoelectric conversion material having favorable orientation is obtained. The shorter diameter of the plate crystal of the calcium cobaltite represented by general formula (1) is preferably 0.5 to 5 µm, particularly preferably 0.5 to 4 µm from the viewpoint that a thermoelectric conversion material having further improved orientation is obtained. The aspect ratio of the plate crystal of the calcium cobaltite represented by general formula (1) is preferably 5 to 20, particularly preferably 8 to 15 from the viewpoint that a reduced contact resistance is achieved. Herein, the longer diameter, the shorter diameter and the aspect ratio of the plate crystal of the calcium cobaltite are the respective average values with respect to 10 particles arbitrarily extracted in the field of view in SEM observation at a magnification of 1000-fold of the plate crystal of the calcium cobaltite.

The plate crystal of the calcium cobaltite represented by general formula (1) is produced by a known method. For example, the plate crystal of the calcium cobaltite represented by general formula (1) is produced by a solid reaction method in which raw materials of a calcium source, a cobalt source, an $M^1$ source, and an $M^2$ source, if necessary added, are mixed in a predetermined compounding ratio, and fired in an acidic atmosphere (see Japanese Patent Laid-Open No. 2001-223393, Japanese Patent No. 3069701, Japanese Patent Laid-Open No. 2006-049796, and the like.). Examples of other methods for producing the plate crystal of the calcium cobaltite represented by general formula (1) include known methods, for example, single crystal production methods such as a flux method, a zone melting method, a pulling method, and a glass annealing method through a glass precursor, powder production methods such as a solid reaction method and a sol-gel method, and thin film production methods such as a sputtering method, a laser abrasion method and a chemical vapor deposition method (see, for example, Japanese Patent Laid-Open No. 2006-049796.).

The calcium compound with respect to the slurry preparation step is not particularly limited as long as it is a compound having a calcium atom, and examples include calcium oxide, calcium chloride, calcium carbonate, calcium nitrate, calcium hydroxide, dimethoxy calcium, diethoxy calcium, and dipropoxy calcium.

The cobalt compound with respect to the slurry preparation step may be any compound as long as such a compound is a compound having a cobalt atom, and examples include cobalt oxide such as CoO, $Co_2O_3$ and $Co_3O_4$, cobalt chloride, cobalt carbonate, cobalt nitrate, cobalt hydroxide, and dipropoxy cobalt.

The bismuth compound with respect to the slurry preparation step may be any compound as long as such a compound is a compound having bismuth, and examples include bismuth oxide such as $Bi_2O_3$ and $Bi_2O_5$, bismuth nitrate, bismuth chloride, bismuth hydroxide, and tripropoxy bismuth.

Various physical properties of the calcium compound, the cobalt compound and the bismuth compound are not particularly limited, and the average particle size determined by a laser diffraction method is preferably 5 µm or less, particularly preferably 0.1 to 3.0 µm from the viewpoint that excellent reactivity is achieved.

In the slurry preparation step, the plate crystal of the calcium cobaltite represented by general formula (1), the calcium compound, the cobalt compound and the bismuth compound are added to a solvent, and mixed and stirred, to thereby prepare a raw slurry in which the respective raw material components are dispersed in the solvent. In the slurry preparation step, it is desirable that such stirring and the like be sufficiently performed to prepare a raw slurry in which the respective raw material components are uniformly dispersed.

The content in the plate crystal of the calcium cobaltite represented by general formula (1) in the raw slurry is preferably 1 to 99% by mass, particularly preferably 10 to 80% by mass based on the total content of the plate crystal of the calcium cobaltite represented by general formula (1), the bismuth compound, the calcium compound and the cobalt compound from the viewpoint that an increase in orientation of the thermoelectric conversion material is achieved.

The bismuth compound not only serves as a bismuth source which allows Bi to be taken and contained in the crystal structure of the composite oxide represented by general formula (2), but also serves as a sintering aid.

In the slurry preparation step, the bismuth compound is preferably contained in the raw slurry so that the f value in the composite oxide represented by general formula (2) satisfies 0<f≤1, preferably 0.2≤f≤0.8, from the viewpoints that the density of the thermoelectric conversion material can be increased and a thermoelectric conversion material having excellent thermoelectric characteristics can be obtained. When a calcium cobaltite including Bi is used as the plate crystal of the calcium cobaltite represented by general formula (1) in the slurry preparation step, the bismuth compound is preferably contained in the raw slurry, in consideration of the amount of Bi included in the calcium cobaltite represented by general formula (1), in an amount so that the f value in the composite oxide represented by general formula (2) satisfies 0<f≤1, preferably 0.2≤f≤0.8, from the viewpoints that the density of the thermoelectric conversion material can be increased and a thermoelectric conversion material having excellent thermoelectric characteristics can be obtained.

In the slurry preparation step, the calcium compound and the cobalt compound are preferably contained in the raw slurry, in consideration of the amounts of Ca and Co included in the calcium cobaltite represented by general formula (1), in amounts so that the g value in the composite oxide represented by general formula (2) satisfies $2.0 \leq g \leq 3.6$, preferably $2.2 \leq g \leq 3.3$, and the i value therein satisfies $3.5 \leq i \leq 4.5$, preferably $3.7 \leq i \leq 4.3$.

Examples of the solvent in the slurry preparation step include water, a mixed solvent of water and a hydrophilic solvent, and an organic solvent.

The slurry concentration (solid content) of the raw slurry is preferably 60 to 75% by mass, particularly preferably 65 to 70% by mass, from the viewpoints that dispersibility of the slurry is achieved and the density of the raw material sheet can be increased in the sheet formation step.

In the slurry preparation step, a dispersant can be added to the raw slurry in order to further improve dispersibility of the solid. Examples of the dispersant include various surfactants, a polycarboxylic acid ammonium salt, an alkyl sulfate salt, a polyoxyethylene alkyl ether sulfate salt, alkyl benzenesulfonate, a naphthalenesulfonic acid formalin condensate, polyoxyethylene alkyl ether, polyoxyethylene sorbitan fatty acid ester, glycerol fatty acid ester, polyoxyethylene alkylamine, and alkylamine oxide. The content of the dispersant in the raw slurry is preferably 0.1 to 10% by mass, particularly preferably 0.5 to 5% by mass from the viewpoint that a sufficient dispersion effect can be exerted.

In the slurry preparation step, the raw slurry preferably contains a binder resin from the viewpoint that proper strength and flexibility are imparted to the raw material sheet. Examples of the binder resin include known binder resins such as acrylic, cellulose-based, polyvinyl alcohol-based, polyvinyl acetal-based, urethane-based, and vinyl acetate-based resins. The content of the binder resin in the raw slurry is preferably 5 to 25% by mass, particularly preferably 10 to 20% by mass from the viewpoint that the binging force between particles can be increased to thereby allow a raw material sheet having a high density and a high strength to be obtained.

In the slurry preparation step, a known plasticizer such as a phthalate-based plasticizer, a fatty acid ester-based plasticizer, or a glycol derivative may be, if necessary, added to the raw slurry.

The sheet formation step is a step of subjecting the raw slurry prepared in the slurry preparation step to sheet formation, to prepare a raw material sheet made of a mixture of raw material components, namely, a sheet containing the plate crystal of the calcium cobaltite represented by general formula (1), the bismuth compound, the calcium compound and the cobalt compound.

It is important in the sheet formation step that the raw material sheet be prepared so that at least the plate crystal of the calcium cobaltite represented by general formula (1) is oriented in the longitudinal direction of the crystal plane, namely, the raw material sheet be prepared so that the sheet surface of the raw material sheet is roughly parallel with the longitudinal direction of the crystal plane of the plate crystal of the calcium cobaltite represented by general formula (1). When the raw slurry is subjected to sheet formation, the plate crystal of the calcium cobaltite represented by general formula (1) is oriented in the longitudinal direction of the crystal plane in the sheet, and therefore the raw slurry containing the plate crystal of the calcium cobaltite represented by general formula (1) is used for sheet formation, thereby providing a raw material sheet in which the plate crystal of the calcium cobaltite represented by general formula (1) is oriented in the longitudinal direction of the crystal plane. Herein, the crystal plane of the plate crystal refers to a plane of the plate crystal, the plane spreading in a two-dimensional direction; the longitudinal direction of the crystal plane of the plate crystal refers to a direction in which the longer diameter of the crystal plane of the plate crystal extends; and the plate crystal being oriented in the longitudinal direction of the crystal plane refers to the plate crystal being oriented so as to allow the longitudinal direction of the crystal plane of each plate crystal to be roughly the same. The sheet surface of the raw material sheet refers to a surface of the raw material sheet, the surface spreading in a two-dimensional direction. The sheet surface of the raw material sheet being roughly parallel with the longitudinal direction of the crystal plane of the plate crystal of the calcium cobaltite represented by general formula (1) refers to the following: the proportion of a plate crystal of the calcium cobaltite represented by general formula (1), in which the inclination of the longitudinal direction relative to the sheet surface of the raw material sheet is within $0\pm20°$, is 60% or more on a number basis. Herein, orienting of the plate crystal is confirmed by cutting the raw material sheet to two portions, and subjecting the cross section obtained by such cutting to SEM observation at a magnification of 1000-fold.

While examples of the method for subjecting the raw slurry to sheet formation to prepare the raw material sheet in the sheet formation step include a method in which a sheet-shaped substrate resin is uniformly coated with the raw slurry by an applicator and a coater, and the resultant is dried to thereby prepare the raw material sheet, the method is not limited thereto, and for example, a method such as a doctor blade method, a press molding method, a rolling method or an extrusion method, or an appropriate combination thereof may be adopted.

The thickness of the raw material sheet prepared in the sheet formation step is preferably 50 to 500 μm, particularly preferably 100 to 350 μm from the viewpoint that an increase in sheet strength resulting in an increase in processability during the stacking step can allow a thermoelectric conversion material excellent in orientation to be obtained.

Thus, the sheet formation step can provide the raw material sheet containing the plate crystal of the calcium cobaltite represented by general formula (1), the bismuth compound, the calcium compound and the cobalt compound, in which the plate crystal of the calcium cobaltite represented by general formula (1) is oriented within the sheet in the longitudinal direction roughly parallel with the sheet surface.

The stacking step is a step of stacking the raw material sheet prepared in the sheet formation step to prepare a raw material sheet laminate. The raw material sheet can be made into a laminate, thereby resulting in an increase in reactivity to easily produce a composite oxide represented by general formula (2), which is high in purity in terms of X-ray diffraction analysis.

The size of the raw material sheet laminate, the number of raw material sheets stacked, and the like are appropriately selected depending on a machine to be used, and the like.

In the stacking step, the raw material sheet laminate can be, if necessary, pressure-bonded to thereby result in a further increase in reactivity of the raw material sheet laminate, and a further increase in orientation of the plate crystal of the calcium cobaltite represented by general formula (1). The pressure in pressure-bonding varies depending on the type of a press machine, the physical properties and types of the raw material sheet, and the like, and it is usually 2.4 to 19.6 MPa, preferably 4.0 to 9.6 MPa. Such pressure-bonding can be performed with application of a temperature of 50 to 200° C., preferably 70 to 150° C., thereby more efficiently pressure-bonding the raw material sheet laminate. Examples of the press machine for use in such pressure-bonding include a hand press machine, a tabletting machine, a briquet machine, and a roller compactor, but the press machine is not particularly limited to such apparatuses.

The firing step is a step of firing the raw material sheet laminate prepared in the stacking step, to thereby provide a thermoelectric conversion material containing the composite oxide represented by general formula (2). In the firing step, the plate crystal of the calcium cobaltite represented by general formula (1) serves as a template, and thus reactions such as a reaction of the plate crystal of the calcium cobaltite and the bismuth compound, and a reaction of the calcium compound, the cobalt compound and the bismuth compound progress and therefore a composite oxide produced has excellent orientation due to excellent orienting of the plate crystal of the calcium cobaltite represented by general formula (1).

In the firing step, the firing temperature is preferably 900 to 980° C., particularly preferably 910 to 960° C. from the viewpoint that a thermoelectric conversion material including a high-density and single-phase composite oxide is obtained. The firing atmosphere is preferably an air atmosphere or an oxygen atmosphere. The firing time is preferably 10 hours or more, particularly preferably 20 to 60 hours.

When the raw slurry contains the binder resin, a heat treatment may also be performed before the firing step, for the main purpose of degreasing. The degreasing temperature is not particularly limited, and may be any temperature which is sufficient for pyrolysis of the binder resin. The degreasing temperature is usually 500° C. or less.

The thermoelectric conversion material obtained by performing the firing step can also be, if necessary, subjected to a surface polishing treatment and cut to a desired size.

The firing step is then performed to thereby provide a thermoelectric conversion material including a sintered product of the plate crystal of the composite oxide represented by general formula (2).

The thermoelectric conversion element of the present invention is a thermoelectric conversion element including a p-type thermoelectric conversion material and an n-type thermoelectric conversion material, wherein the p-type thermoelectric conversion material is the thermoelectric conversion material of the present invention.

The n-type thermoelectric conversion material in the thermoelectric conversion element of the present invention is preferably at least one selected from a calcium-manganese-based composite oxide represented by the following general formula (3) and a calcium-manganese-based composite oxide represented by the following general formula (4).

General formula (3):

$$Ca_{1-x}A^1_xMn_{1-y}A^2_yO_z \quad (3)$$

wherein $A^1$ represents at least one element selected from the group consisting of Ce, Pr, Nd, Sm, Eu, Gd, Yb, Dy, Ho, Er, Tm, Tb, Lu, Sr, Ba, Al, Bi, Y and La, and $A^2$ represents at least one element selected from the group consisting of Ta, Nb, W, V and Mo; and x satisfies $0 \leq x \leq 0.5$, y satisfies $0 \leq y \leq 0.2$ and z satisfies $2.7 \leq z \leq 3.3$.

General formula (4):

$$(Ca_{1-s}A^3_s)Mn_{1-t}A^4_tO_u \quad (4)$$

wherein $A^3$ represents at least one element selected from the group consisting of Ce, Pr, Nd, Sm, Eu, Gd, Yb, Dy, Ho, Er, Tm, Tb, Lu, Sr, Ba, Al, Bi, Y and La, and $A^4$ represents at least one element selected from the group consisting of Ta, Nb, W, V and Mo; and s satisfies $0 \leq s \leq 0.5$, t satisfies $0 \leq t \leq 0.2$ and u satisfies $3.6 \leq u \leq 4.4$.

The calcium-manganese-based composite oxide represented by general formula (3) and the calcium-manganese-based composite oxide represented by general formula (4) are each a known compound, and have a negative Seebeck coefficient. When the temperature difference is generated between both ends of a material made of such a composite oxide, the potential generated by a thermoelectric force is higher at an end with a higher temperature than an end with a lower temperature, and characteristics as the n-type thermoelectric conversion material are exhibited.

The calcium-manganese-based composite oxide represented by general formula (3) is a calcium-manganese-based composite oxide having a perovskite-type crystal structure, in which Ca is, if necessary, partially replaced with the $A^1$ element and Mn is, if necessary, partially replaced with the $A^2$ element.

In general formula (3), $A^1$ and $A^2$ each represent an element which is, if necessary, contained for the purpose of imparting electric conductivity.

The calcium-manganese-based composite oxide represented by general formula (4) is a calcium-manganese-based composite oxide having a layered perovskite structure, in which Ca is, if necessary, partially replaced with the $A^3$ element and Mn is, if necessary, partially replaced with the $A^4$ element.

In general formula (4), $A^3$ and $A^4$ each represent an element which is, if necessary, contained for the purpose of imparting electric conductivity.

The calcium-manganese-based composite oxide represented by the following general formula (3) and the calcium-manganese-based composite oxide represented by the following general formula (4) are each produced by a known method, and can be produced by, for example, mixing raw materials so that the same metal component ratio as the metal component ratio of an objective calcium-manganese-based composite oxide is achieved, and firing the resultant (see Japanese Patent Laid-Open No. 2006-49796, Japanese Patent Laid-Open No. 2010-37131, Japanese Patent Laid-Open No. 2010-195620, and the like). Furthermore, the resulting calcium-manganese-based composite oxide can be filled into a mold having a predetermined shape, subjected to molding under pressure and sintered under normal pressure, thereby providing an n-type thermoelectric conversion material having a predetermined shape.

The thermoelectric conversion element of the present invention is obtained by electrically connecting one end of the p-type thermoelectric conversion material and one end of the n-type thermoelectric conversion material.

The shapes, sizes, and the like of the p-type thermoelectric conversion material and the n-type thermoelectric conversion material are not particularly limited, and are appropriately selected depending on the size, shape, and the like of the thermoelectric conversion module so that required thermoelectric performances can be exhibited.

The method for electrically connecting one end of the p-type thermoelectric conversion material and one end of the n-type thermoelectric conversion material is not particularly limited, and any method which can withstand the use temperature range (293 to 1223 K (absolute temperature)) of the thermoelectric conversion module of the present invention may be adopted. Examples include a method in which a joining material is used to bond one end of the p-type thermoelectric conversion material and one end of the n-type thermoelectric conversion material to a conductive material, a method in which one end of the p-type thermoelectric conversion material and one end of the n-type thermoelectric conversion material are pressure-bonded or sintered directly or with a conductive material interposed, and a method in which the p-type thermoelectric conversion material and the n-type thermoelectric conversion material are electrically connected by use of a conductor material.

FIG. 1 illustrates a schematic view of one embodiment of the thermoelectric conversion element of the present invention. In FIG. 1, a thermoelectric conversion element 10 includes a p-type thermoelectric conversion material (P), an n-type thermoelectric conversion material (N), an electrode (1), an electrode (1a) and a binder (2). The p-type thermoelectric conversion material (P) is connected to the electrode (1) and the electrode (1a) via the binder (2). The n-type thermoelectric conversion material (N) is connected to the electrode (1) and the electrode (1a) via the binder (2).

As the binder (2), a metal paste, a solder or the like is used, and in particular, a noble metal which can be used even at a high temperature of about 1223 K, such as gold, silver or platinum, or a paste including such a noble metal is suitable.

As each of the electrode (1) and the electrode (1a), a noble metal which can be used even at a high temperature of about 1223 K, such as gold, silver or platinum, or a paste including such a noble metal is suitable.

An insulating substrate (not illustrated) may also be further connected to the electrode (1a) via the binder (2). The insulating substrate is used for the purposes of enhancements in heat uniformity and mechanical strength, keeping of electrical insulation, and the like. The insulating substrate is preferably oxide ceramics such as alumina.

The thermoelectric conversion module of the present invention is a thermoelectric conversion module including a plurality of the thermoelectric conversion elements of the present invention, and an unjointed end of the p-type thermoelectric conversion material of one of the thermoelectric conversion elements is connected to an unconnected end of the n-type thermoelectric conversion material of other of the thermoelectric conversion elements to thereby connect the plurality of the thermoelectric conversion elements in series.

An end of the p-type thermoelectric conversion element and an end of the n-type thermoelectric conversion material of other of the thermoelectric conversion elements are usually connected on the insulating substrate by a method of bonding unjointed ends of the thermoelectric conversion elements to the substrate by use of the binder.

The number of the thermoelectric conversion elements for use in one thermoelectric conversion module is not particularly limited, and is arbitrarily selected depending on a required power.

FIGS. 2A through 2D each illustrates a schematic view of one embodiment of the thermoelectric conversion module. In FIGS. 2A through 2D, eight thermoelectric conversion elements are used. The output of the module is almost the same as the value obtained by multiplying the output of the thermoelectric conversion element by the number of the thermoelectric conversion elements used.

The thermoelectric conversion module of the present invention can generate a voltage by disposing one end of the module on a hot section and disposing other end thereof on a cold section. For example, in the thermoelectric conversion module in FIGS. 2A through 2D, the substrate surface may be disposed on a hot section and other end may be disposed on a cold section.

Figure 2A:
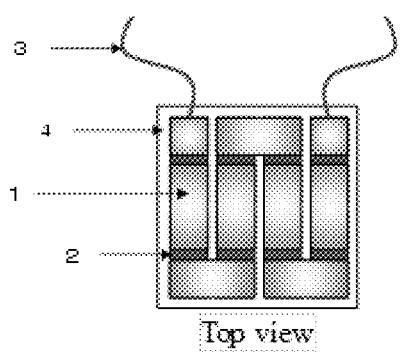
Figure 2B:
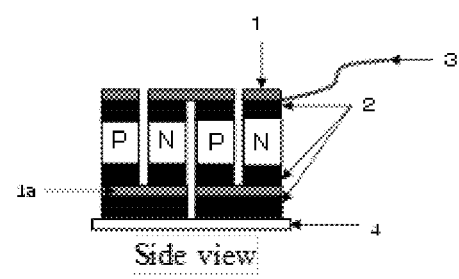
Figure 2C:
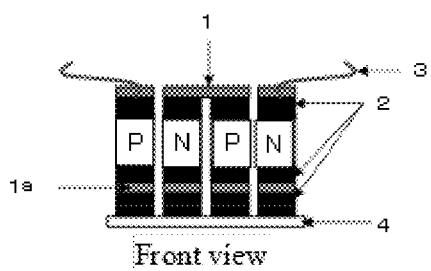
Figure 2D:
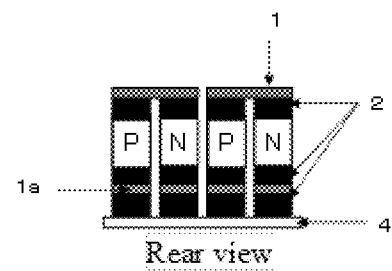
Figure 3:
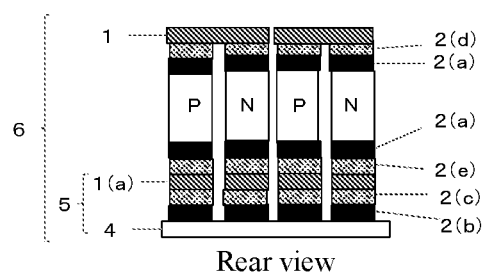
FIG. 3 is a rear view of the thermoelectric conversion module in FIGS. 2A through 2D.

For example, one example of the method for preparing the thermoelectric conversion module illustrated in FIGS. 2A through 2D is described based on FIG. 3 which further specifically illustrates the rear view illustrated in FIG. 2D.

First, a silver paste or the like is screen-printed on an end of each of the n-type thermoelectric conversion material (N) and the p-type thermoelectric conversion material (P), dried, and thereafter fired to form a binder (2a) layer on the end of each of the n-type thermoelectric conversion material (N) and the p-type thermoelectric conversion material (P).

Next, a silver paste or the like is screen-printed on an insulating substrate (4) such as an alumina substrate in a predetermined pattern, dried, and thereafter fired to form a binder (2b) layer. A silver paste or the like is further screen-printed on the binder (2b) layer, and an electrode (1a) such as a silver electrode is disposed thereon, and then dried to provide a structure, and thereafter the structure is heated and pressure-bonded to produce a lower electrode substrate (5).

Next, a silver paste or the like is screen-printed on the electrode (1a) on the lower electrode substrate (5), the n-type thermoelectric conversion material (N) and the p-type thermoelectric conversion material (P) are alternately disposed, and then dried to form a binder (2e) layer. Next, an electrode (1) such as silver coated with a binder (2d) such as a silver paste is disposed onto the thermoelectric conversion materials aligned (P, N) so that the n-type thermoelectric conversion material (N) and the p-type thermoelectric conversion material (P) are connected in series in a π-character shape, and the resultant is dried to provide a structure (6). Next, the structure (6) is heated and pressure-bonded, and then fired to thereby enable to produce the thermoelectric conversion module in FIGS. 2A through 2D.

Examples of the heat source of the hot section include an automotive engine; a factory; a thermal or nuclear power station; various fuel cells such as a molten carbonate fuel cell (MCFC), a hydrogen membrane separation fuel cell (HMFC) and a solid oxide fuel cell (SOFC); and high-temperature heat at about 200° C. or higher, released from various co-generation systems such as gas engine type and gas turbine type systems, and low-temperature heat at about 20 to 200° C., such as solar heat, boiling water, and body temperature.

With respect to the use temperature of the thermoelectric conversion module of the present invention, the thermoelectric conversion module of the present invention can be used in the temperature range of 773 to 1223 K (absolute temperature), and can be particularly used in the high temperature range of 873 to 1223 K (absolute temperature).

The thermoelectric conversion module of the present invention is excellent in heat durability, and is not broken and is also hardly deteriorated in electricity generation characteristics even if the hot section is rapidly cooled from a high temperature of about 1073 K to room temperature.

The thermoelectric conversion module of the present invention not only is small and has a high output density, but also has resistance to thermal shock, and therefore can be applied to not only utilization of waste heat, such as a factory, a garbage incinerator, a thermal/nuclear power station, and various fuel cells and co-generation systems, but also thermoelectric generation utilizing an automotive engine where the change in temperature is severe.

EXAMPLES

Hereinafter, the present invention will be described with reference to Examples, but the present invention is not limited to these Examples.

<Calcium Cobaltite>

Calcium carbonate (average particle size: 1.4 μm), cobalt oxide ($Co_3O_4$, average particle size: 1.1 μm) and bismuth oxide ($Bi_2O_3$, average particle size: 2.5 μm) were loaded so that the molar ratio of calcium, cobalt and bismuth in terms of atom was 3.105:4:0.3, and the resultant was mixed by a mixer. Next, the mixture was filled in sagger made of mullite cordierite, fired in the air atmosphere at 930° C. for 10 hours, thereafter pulverized and cracked, and classified by a 200-mesh sieve, to produce a calcium cobaltite.

The resulting fired product was analyzed by XRD, and thus confirmed to be single-phase calcium cobaltite ($Bi_{0.30}Ca_{3.105}Co_4O_9$) in terms of X-ray diffraction.

Various physical properties of the resulting calcium cobaltite are shown in Table 1.

TABLE 1

Various physical properties of calcium cobaltite

| Longer diameter (μm) | Shorter diameter (μm) | Aspect ratio |
|---|---|---|
| 10.1 | 1.0 | 10.6 |

Figure 4:
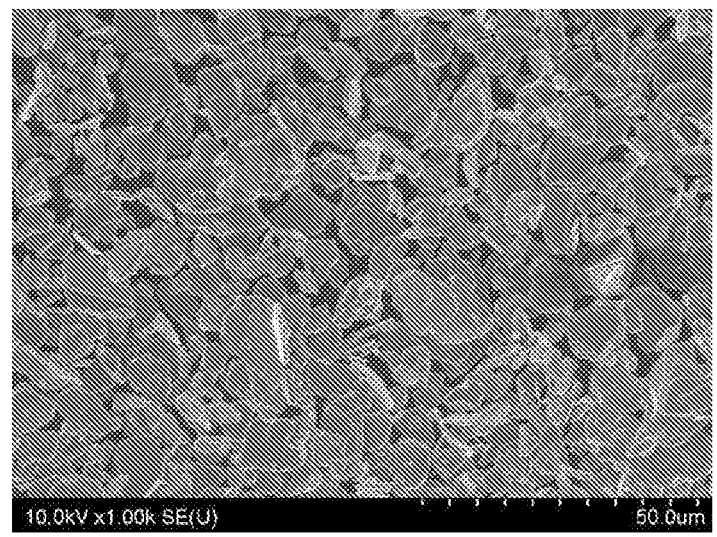
FIG. 4 is a SEM photograph of calcium cobaltite used in Examples.

Herein, the longer diameter, the shorter diameter and the aspect ratio are the respective average values with respect to 10 particles arbitrarily extracted in the field of view in SEM observation at a magnification of 1000-fold of the resulting calcium cobaltite particle. A SEM photograph of the resulting calcium cobaltite is illustrated in FIG. 4.

Examples 1 to 5 and Comparative Examples 1 to 4

The calcium cobaltite, the calcium carbonate (average particle size: 1.4 μm), the cobalt oxide ($Co_3O_4$, average particle size: 1.1 μm) and the bismuth oxide ($Bi_2O_3$, average particle size: 2.5 μm) obtained above were loaded into a vessel in each compounding amount shown in Table 2.

Next, an aqueous solution including 1% by mass of a dispersant and 2% by mass of ethanol were added to the vessel so that the slurry concentration was 68.5% by mass.

Next, the resultant was sufficiently stirred by a mixer, and thereafter an acrylic substance (AS-2000, produced by Toagosei Co., Ltd.) as a binder resin was added so that the content was 10% by mass, and the resultant was sufficiently stirred to prepare a raw slurry.

Next, a base film was coated with the raw slurry at a rate of 10 mm/sec by an applicator and an automatic coater for imparting a coating thickness of 250 μm, and then dried at 60° C. for 30 minutes to produce a raw material sheet on the base film. Next, the base film was peeled, the resultant was cut to a proper size (about 2 cm in length and about 2 cm in width), and several thereof were stacked so that the thickness after sintering was about 3.5 mm, and thereafter pressure-bonded at 4.9 MPa by a press machine heated to 100° C., to prepare a raw material sheet laminate.

Next, the raw material sheet laminate was subjected to degreasing at 300° C. for 15 hours, and thereafter fired in an air atmosphere at 930° C. for 40 hours, to provide a thermoelectric conversion material. The resulting thermoelectric conversion material was cut to a size measurable with an apparatus for evaluating thermoelectric characteristics, and the surface obtained by such cutting was flattened by a polishing machine to prepare a p-type thermoelectric conversion material.

Reference Example 1

The calcium cobaltite obtained above was used to prepare a p-type thermoelectric conversion material according to a pressure sintering method based on the description in Example 1 of Japanese Patent Laid-Open No. 2006-49796.

Herein, sintering by hot-pressing was performed under a uniaxial pressure of 10 MPa at 1123 K for 20 hours.

TABLE 2

| | $Bi_{0.30}Ca_{3.105}Co_4O_9$ (parts by mass) | $CaCO_3$ (parts by mass) | $Co_3O_4$ (parts by mass) | $Bi_2O_3$ (parts by mass) |
|---|---|---|---|---|
| Example 1 | 0.15 | 0.32 | 0.33 | 0.19 |
| Example 2 | 0.14 | 0.31 | 0.32 | 0.22 |
| Example 3 | 0.66 | 0.09 | 0.09 | 0.15 |
| Example 4 | 0.48 | 0.18 | 0.18 | 0.17 |
| Example 5 | 0.31 | 0.25 | 0.26 | 0.18 |
| Comparative Example 1 | 1.00 | — | — | — |
| Comparative Example 2 | 0.87 | — | — | 0.13 |
| Comparative Example 3 | 0.20 | 0.35 | 0.36 | 0.09 |
| Comparative Example 4 | — | 0.39 | 0.40 | 0.21 |
| Reference Example 1 | 1.00 | — | — | — |

<Evaluation of Various Physical Properties>

The density of the thermoelectric conversion material obtained in each of Examples, Comparative Examples and Reference Example was measured. The composite oxide contained in the thermoelectric conversion material was confirmed by X-ray diffraction analysis and ICP analysis. The results are shown in Table 3.

Figure 5:
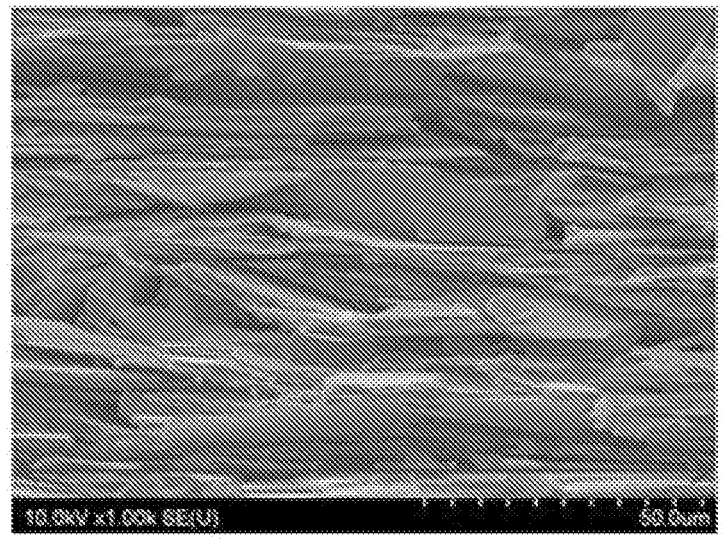
FIG. 5 is a SEM photograph of a cross section of a thermoelectric conversion material obtained in Example 1 (magnification: 1000-fold).
Figure 6:
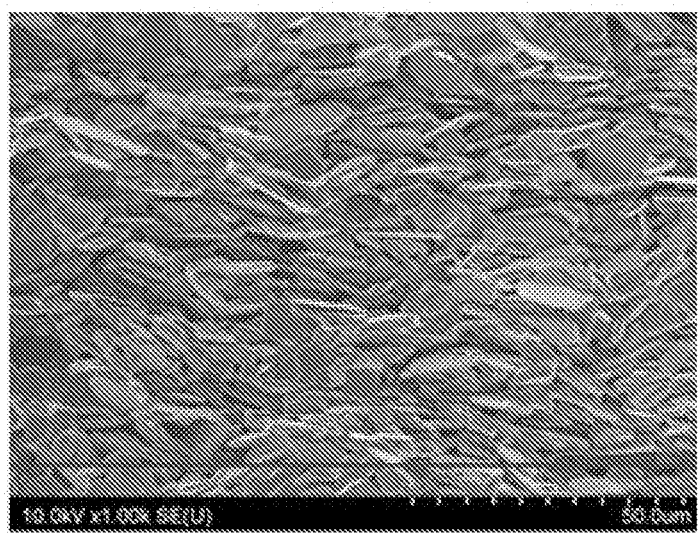
FIG. 6 is a SEM photograph of a cross section of a thermoelectric conversion material obtained in Comparative Example 1 (magnification: 1000-fold).

The thermoelectric conversion materials of Example 1 and Comparative Example 1 were each cut into two portions by hand, and SEM photographs of the cross sections obtained by such cutting of the thermoelectric conversion materials of Example 1 and Comparative Example 1 were shown in FIG. 5 and FIG. 6, respectively.

(Evaluation of Average Longer Diameter Length, Average Shorter Diameter Length and Aspect Ratio)

The average longer diameter length, the average shorter diameter length and the aspect ratio are the respective average values with respect to 10 particles arbitrarily extracted in the field of view in SEM observation at a magnification of 1000-fold of the cross section obtained by cutting of the p-type thermoelectric conversion material into two portions by hand.

(Evaluation of Orienting State)

The p-type thermoelectric conversion material was cut into two portions by hand, and the cross section obtained by such cutting was observed by SEM at a magnification of 1000-fold, to determine the proportion of a plate crystal of the composite oxide, in which the inclination of the longitudinal direction relative to the surface of the thermoelectric conversion material was within 0±20°.

Symbols in the Table represent the following.

Excellent: the proportion of a plate crystal of the composite oxide, in which the inclination of the longitudinal direction relative to the surface of the thermoelectric conversion material was within 0±20°, was 80% or more Good: the proportion of a plate crystal of the composite oxide, in which the inclination of the longitudinal direction relative to the surface of the thermoelectric conversion material was within 0±20°, was 60% or more and less than 80%

Fair: the proportion of a plate crystal of the composite oxide, in which the inclination of the longitudinal direction relative to the surface of the thermoelectric conversion material was within 0±20°, was 40% or more and less than 60%

Poor: the proportion of a plate crystal of the composite oxide, in which the inclination of the longitudinal direction relative to the surface of the thermoelectric conversion material was within 0±20°, was less than 40%

1 to 5) was higher in power factor and had more excellent thermoelectric characteristics than the thermoelectric conversion material obtained in each of Comparative Examples, and had almost the same thermoelectric characteristics as those of the thermoelectric conversion material (Reference Example 1) obtained according to a pressure sintering method.

TABLE 3

|  | Composite oxide | Density (g/cm$^3$) | Average longer diameter (μm) | Average shorter diameter (μm) | Aspect ratio | Orientation |
| --- | --- | --- | --- | --- | --- | --- |
| Example 1 | $Bi_{0.62}Ca_{3.105}Co_4O_9$ | 4.3 | 46.8 | 1.0 | 49.9 | Good |
| Example 2 | $Bi_{0.72}Ca_{3.105}Co_4O_9$ | 4.4 | 28.1 | 1.3 | 22.7 | Good |
| Example 3 | $Bi_{0.51}Ca_{3.105}Co_4O_9$ | 4.4 | 33.1 | 1.1 | 33.1 | Good |
| Example 4 | $Bi_{0.51}Ca_{3.105}Co_4O_9$ | 4.4 | 25.6 | 0.9 | 28.2 | Good |
| Example 5 | $Bi_{0.51}Ca_{3.105}Co_4O_9$ | 4.2 | 27.5 | 0.9 | 30.1 | Good |
| Comparative Example 1 | $Bi_{0.30}Ca_{3.105}Co_4O_9$ | 3.3 | 10.8 | 1.1 | 10.1 | Poor |
| Comparative Example 2 | $Bi_{0.51}Ca_{3.105}Co_4O_9$ | 4.4 | 24.9 | 1.7 | 13.0 | Good |
| Comparative Example 3 | $Bi_{0.30}Ca_{3.105}Co_4O_9$ | 3.2 | 17.1 | 1.2 | 14.2 | Good |
| Comparative Example 4 | $Bi_{0.51}Ca_{3.105}Co_4O_9$ | 3.0 | 27.0 | 0.9 | 29.6 | Poor |
| Reference Example 1 | $Bi_{0.30}Ca_{3.105}Co_4O_9$ | 5.0 | 13.7 | 0.7 | 19.7 | Excellent |

<Evaluation of Thermoelectric Conversion Characteristics>

The p-type thermoelectric conversion material obtained in each of Examples, Comparative Examples and Reference Example was subjected to measurements of the specific resistance value and the thermoelectric force in an air atmosphere at 800° C. with an apparatus for evaluating thermoelectric characteristics (ZEM-3 manufactured by ULVAC Inc.), and the power factor was further calculated.

Herein, the power factor is determined by the following calculation expression (1), the power factor is an index representing the power which can be taken out from the thermoelectric conversion material, and it is indicated that, as the value of the index is higher, the output is higher.

Power factor (P.F.)=$S^2/\rho$ (1)

(S: thermoelectric force, $\rho$: specific resistance value)

TABLE 4

|  | Composite oxide | Specific resistance value (mΩ cm) | Thermo-electric force (μV/K) | P.F. (mW/m K$^2$) |
| --- | --- | --- | --- | --- |
| Example 1 | $Bi_{0.62}Ca_{3.105}Co_4O_9$ | 6.1 | 181 | 0.54 |
| Example 2 | $Bi_{0.72}Ca_{3.105}Co_4O_9$ | 5.8 | 177 | 0.54 |
| Example 3 | $Bi_{0.51}Ca_{3.105}Co_4O_9$ | 6.6 | 178 | 0.50 |
| Example 4 | $Bi_{0.51}Ca_{3.105}Co_4O_9$ | 6.7 | 180 | 0.50 |
| Example 5 | $Bi_{0.51}Ca_{3.105}Co_4O_9$ | 7.3 | 177 | 0.49 |
| Comparative Example 1 | $Bi_{0.30}Ca_{3.105}Co_4O_9$ | 16.0 | 173 | 0.19 |
| Comparative Example 2 | $Bi_{0.51}Ca_{3.105}Co_4O_9$ | 8.7 | 176 | 0.35 |
| Comparative Example 3 | $Bi_{0.30}Ca_{3.105}Co_4O_9$ | 9.5 | 178 | 0.22 |
| Comparative Example 4 | $Bi_{0.51}Ca_{3.105}Co_4O_9$ | 14.5 | 179 | 0.22 |
| Reference Example 1 | $Bi_{0.30}Ca_{3.105}Co_4O_9$ | 5.6 | 176 | 0.56 |

It was found from Table 4 that the thermoelectric conversion material of the present invention (each of Examples (Production of Thermoelectric Conversion Module)

<Production of N-type Thermoelectric Conversion Material>

Calcium carbonate and manganese oxide were weighed so that the molar ratio of calcium and manganese was 1.0:1.0, and were loaded into a tank. Water and a dispersant (polycarboxylic acid ammonium salt) were added to the tank, to prepare a slurry in which the slurry concentration was 30% by mass. The concentration of the dispersant was 2% by mass. The slurry was fed, with stirring, to a media stirring type bead mill into which zirconia beads having a diameter of 0.5 mm were loaded, and was mixed for 90 minutes to perform wet pulverizing. Next, the slurry was fed at a feed rate of 3 L/h to a spray drier set at 200° C., to provide a dry raw material. The dry raw material was loaded into an electric furnace, and fired with being left to stand in the air at 850° C. for 5 hours. The fired product was subjected to X-ray diffraction measurement, and it was confirmed that a single phase of $CaMnO_3$ was obtained. The fired product was loaded into a mold, and pressurized at a pressure of 2 t/cm$^2$ to produce a molded product. The molded product was loaded into an electric furnace, and heat-treated at 1250° C. for 12 hours to provide an n-type thermoelectric conversion material.

The thermoelectric conversion material of Example 1 was used as the p-type thermoelectric conversion material, and the n-type thermoelectric conversion material prepared above was used as the n-type thermoelectric conversion material, to produce a thermoelectric conversion module. Hereinafter, the description will be made with reference to FIG. 3.

<Step A: Production of Binder (2a) Layer on End Surface of each Thermoelectric Conversion Material (P, N)>

A silver paste was screen-printed on an end surface of each of n-type thermoelectric conversion material (N) and p-type thermoelectric conversion material (P) produced in Example 1, and was dried by a drier at 120° C. for 15 minutes and then heated in an electric furnace at 850° C. for 1 hour, to form binder (2a) layer on an end surface of the thermoelectric conversion material.

<Step B: Production of Lower Electrode Substrate (5)>

A silver paste was printed on alumina substrate (4) in a predetermined pattern, and dried by a drier at 120° C. for 15 minutes and then heated in an electric furnace at 850° C. for 1 hour, to form binder (2b) layer. Silver paste (2c) was further printed on binder (2b) layer, and silver electrode (1a) was disposed and then dried by a drier at 120° C. for 30 minutes. Structure (5) where silver electrode (1a) was disposed was pressure-bonded by heating at 200° C. and at a load of 35 kN for 15 minutes, to provide lower electrode substrate (5).

<Step C: Production of Thermoelectric Conversion Module>

Silver paste (2e) was printed as a joining material layer on lower electrode (1a), and n-type thermoelectric conversion material (N) and p-type thermoelectric conversion material (P) having binder (2a) layer were alternately disposed on an end surface of the thermoelectric conversion material produced in Step A and then dried by a drier at 120° C. for 30 minutes. Silver electrode (1) where binder (2a) layer on the thermoelectric conversion material aligned was coated with silver paste (2d) was disposed so that n-type thermoelectric conversion material (N) and p-type thermoelectric conversion material (P) were connected in series in a π-character shape, and was dried by a drier at 120° C. for 30 minutes to provide structure (6). Next, structure (6) was pressure-bonded by heating at 200° C. and at a load of 35 kN for 15 minutes, and then heated in an electric furnace at 850° C. for 1 hour to produce a thermoelectric conversion module.

(Electricity Generation Test)

Prepared were 50 of n-type thermoelectric conversion materials and 50 of p-type thermoelectric conversion materials, each having a size of 3.5 mm×3.5 mm×7.5 mm, by the above method, and thereafter disposed on an alumina substrate by the above method to produce a thermoelectric conversion module of 42 mm square. A plate heater at 500° C. was brought into contact with one surface of the module, and a water-cooled plate to which cooling water at 20° C. flowed was brought into contact with an opposite surface thereof, to perform the electricity generation test. The temperature of the thermoelectric conversion material at a higher temperature was 357° C., the temperature of the thermoelectric conversion material at a lower temperature was 92° C., and the temperature difference was 265° C. A maximum output of 0.6 W was here observed.

The invention claimed is:

1. A thermoelectric conversion material, wherein
the thermoelectric conversion material is a sintered product of a plate crystal of a composite oxide represented by the following general formula (2):

$$Bi_f Ca_g M^3_h Co_i M^4_j O_k \quad (2)$$

wherein $M^3$ represents one or more elements selected from the group consisting of Na, K, Li, Ti, V, Cr, Mn, Fe, Ni, Cu, Zn, Pb, Sr, Ba, Al, Y and lanthanoid, and $M^4$ represents one or more elements selected from the group consisting of Ti, V, Cr, Mn, Fe, Ni, Cu, Mo, W, Nb and Ta; f satisfies 0.51≤f≤1.0, g satisfies 2.0≤g≤3.6, h satisfies 0≤h≤1.0, i satisfies 3.5≤i≤4.5, j satisfies 0≤j≤0.5, and k satisfies 8.0≤k≤10.0;

the thermoelectric conversion material has a density of 4.0 to 5.1 g/cm³;

a proportion of a plate crystal of the composite oxide represented by general formula (2), in which an inclination of a longitudinal direction relative to a surface of the thermoelectric conversion material is within 0±20° in SEM observation, is 60% or more on a number basis; and the plate crystal of the composite oxide represented by general formula (2) has an average longer diameter length of 20 μm or more and an aspect ratio of 20 or more.

2. The thermoelectric conversion material according to claim 1, wherein, in the general formula (2), f satisfies 0.51≤f≤1.0, g satisfies 3.0<g≤3.3, h satisfies 0≤h≤1.0, i satisfies 3.5≤i≤4.5, j satisfies 0≤j≤0.5, and k satisfies 8.0≤k≤10.0.

3. A thermoelectric conversion element comprising a p-type thermoelectric conversion material and an n-type thermoelectric conversion material, wherein the p-type thermoelectric conversion material is the thermoelectric conversion material according to claim 1.

4. The thermoelectric conversion element according to claim 3, wherein the n-type thermoelectric conversion material is at least one selected from a calcium-manganese-based composite oxide represented by the following general formula (3) and a calcium-manganese-based composite oxide represented by the following general formula (4):

General formula (3):

$$Ca_{1-x}Al_x Mn_{1-y}A^2_y O_z \quad (3)$$

wherein $A^1$ represents at least one element selected from the group consisting of Ce, Pr, Nd, Sm, Eu, Gd, Yb, Dy, Ho, Er, Tm, Tb, Lu, Sr, Ba, Al, Bi, Y and La, and $A^2$ represents at least one element selected from the group consisting of Ta, Nb, W, V and Mo; and x satisfies 0≤x≤0.5, y satisfies 0≤y≤0.2 and z satisfies 2.7≤z≤3.3; and General formula (4):

$$(Ca_{1-s}A^3_s)Mn_{1-t}A^4_t O_u \quad (4)$$

wherein $A^3$ represents at least one element selected from the group consisting of Ce, Pr, Nd, Sm, Eu, Gd, Yb, Dy, Ho, Er, Tm, Tb, Lu, Sr, Ba, Al, Bi, Y and La, and $A^4$ represents at least one element selected from the group consisting of Ta, Nb, W, V and Mo; and s satisfies 0≤s≤0.5, t satisfies 0≤t≤0.2 and u satisfies 3.6≤u≤4.4.

5. A thermoelectric conversion module comprising the thermoelectric conversion element according to claim 3.

* * * * *